United States Patent
Zhou et al.

(10) Patent No.: US 9,774,202 B2
(45) Date of Patent: Sep. 26, 2017

(54) MASTER MONITORING SYSTEM FOR CHARGING OF SUPER CAPACITOR

(71) Applicant: CHINA UNIVERSITY OF MINING AND TECHNOLOGY, Jiangsu (CN)

(72) Inventors: Gongbo Zhou, Jiangsu (CN); Zhencai Zhu, Jiangsu (CN); Houlian Wang, Jiangsu (CN); Yang Li, Jiangsu (CN); Wei Li, Jiangsu (CN); Guohua Cao, Jiangsu (CN)

(73) Assignee: CHINA UNIVERSITY OF MINING AND TECHNOLOGY, Jiangsu (CN)

( * ) Notice: Subject to any disclaimer, the term of this patent is extended or adjusted under 35 U.S.C. 154(b) by 106 days.

(21) Appl. No.: 14/917,500

(22) PCT Filed: Apr. 28, 2015

(86) PCT No.: PCT/CN2015/077610
§ 371 (c)(1),
(2) Date: Mar. 8, 2016

(87) PCT Pub. No.: WO2015/169159
PCT Pub. Date: Nov. 12, 2015

(65) Prior Publication Data
US 2016/0218540 A1  Jul. 28, 2016

(30) Foreign Application Priority Data
May 5, 2014  (CN) .......................... 2014 1 0186801

(51) Int. Cl.
*H02J 7/00* (2006.01)
*G01R 31/36* (2006.01)
*H02J 7/34* (2006.01)

(52) U.S. Cl.
CPC ........ *H02J 7/0052* (2013.01); *G01R 31/3624* (2013.01); *G01R 31/3651* (2013.01);
(Continued)

(58) Field of Classification Search
CPC ...... H02J 7/0052; H02J 7/0047; H02J 7/0072; H02J 7/345; G01R 31/3624; G01R 31/3651; G01R 31/3689
(Continued)

(56) References Cited

U.S. PATENT DOCUMENTS

2010/0270983 A1  10/2010  Gong et al.

FOREIGN PATENT DOCUMENTS

| CN | 101574932 A | 11/2009 |
| CN | 201472277 U | 5/2010 |

(Continued)

*Primary Examiner* — Stacy Whitmore
(74) *Attorney, Agent, or Firm* — Saliwanchik, Lloyd & Eisenschenk

(57) ABSTRACT

A monitoring system for charging of a super capacitor, comprising three parts, i.e. a power line, monomer super capacitor monitoring subsystems and a master monitoring system, wherein the master monitoring system comprises a charging circuit (2), a power supply unit (7), a master single chip microcomputer (4), a carrier communication module (3), a human-machine interface module (5), a storage unit (6) and an RS-232 module (8); and each of the monomer super capacitor monitoring subsystems comprises a monomer super capacitor (1), a power supply unit (7), a slave single chip microcomputer (11), a carrier communication module (3), a voltage, current and temperature detection unit (9) and a storage unit (6). The master monitoring system charges a super capacitor group through the power line and the charging circuit. The monitoring system can control the charge states of various monomer super capacitors, thereby avoiding the occurrence of an over-charging phenomenon.

1 Claim, 1 Drawing Sheet

(52) U.S. Cl.
CPC ........ *G01R 31/3689* (2013.01); *H02J 7/0021* (2013.01); *H02J 7/0047* (2013.01); *H02J 7/0072* (2013.01); *H02J 7/345* (2013.01); *H02J 2007/0096* (2013.01); *Y02B 40/90* (2013.01)

(58) Field of Classification Search
USPC ........................................................ 320/167
See application file for complete search history.

(56) References Cited

FOREIGN PATENT DOCUMENTS

| | | |
|---|---|---|
| CN | 203119559 U | 8/2013 |
| CN | 103312029 A | 9/2013 |
| CN | 203406677 U | 1/2014 |
| CN | 103956791 A | 7/2014 |
| CN | 203951214 U | 11/2014 |
| JP | 2005-218180 A | 8/2005 |

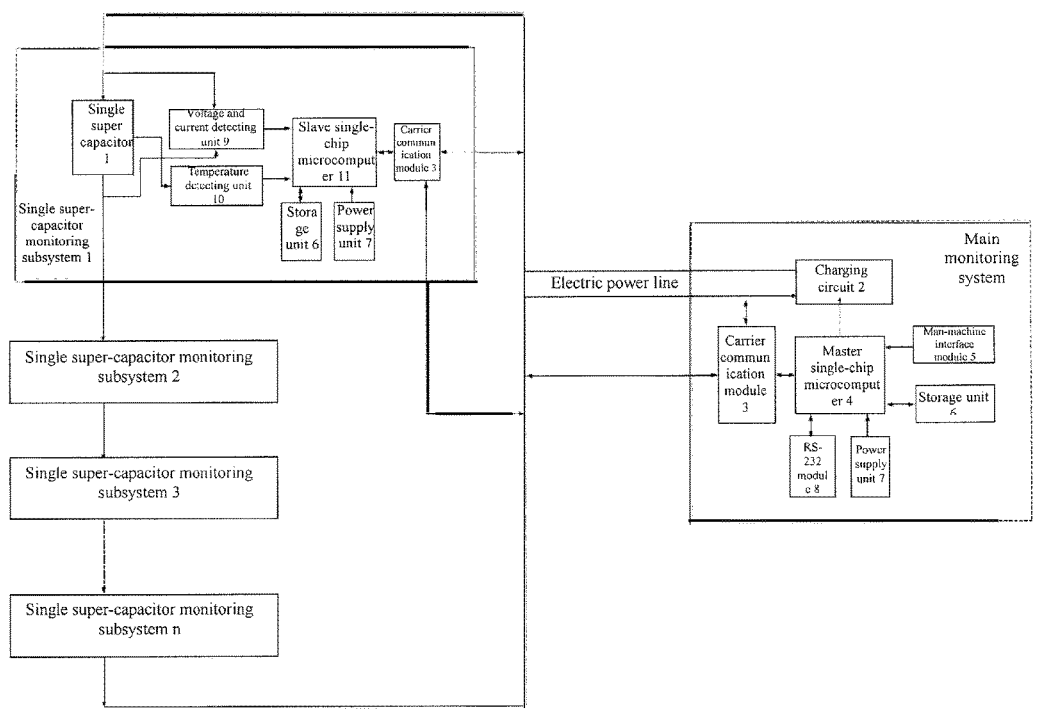

MASTER MONITORING SYSTEM FOR CHARGING OF SUPER CAPACITOR

CROSS REFERENCE TO A RELATED APPLICATION

This application is a National Stage Application of International Application Number PCT/CN2015/077610, filed Apr. 28, 2015; which claims priority to Chinese Patent Application No. 201410186801.1, filed May 5, 2014; both of which are incorporated herein by reference in their entirety.

FIELD OF THE INVENTION

The present invention relates to a charging monitoring system, in particular to a super-capacitor charging main monitoring system.

BACKGROUND OF THE INVENTION

Super capacitors are physical secondary power sources that have super electric energy storage capacity and can provide high impulse power, and have advantages including high reliability, favorable cryogenic properties, environment friendliness, and free of pollution. They are novel energy storage systems and an effective approach for solving the problem of inadequate charging powers in existing batteries, and they are widely applied in a variety of industries, such as new energy vehicles, electricity, elevator, coal mine, and engineering machinery industries.

Power line carrier communication is an electric system communication approach that employs electric power transmission lines as the transmission medium for carrier signals. Electric power transmission lines have robust structural supports, and it is economical and reliable to transmit carrier signals along with power current through electric power transmission lines.

At present, battery management systems are mainly in a master/slave design, so as to monitor the capacitor status information of individual batteries in battery supply systems. A master control system is responsible for collecting the status information of the individual batteries from multiple modules, and then analyzing the status information. However, the charging process of a series super capacitors follows a "cask principle", and the breaking point of failure usually bursts at a single capacitor. Employing a centralized monitoring approach may result in degraded efficiency and increased system load.

Hence, the present invention puts forward a monitoring strategy based on distributed decision-making, and utilizes power line carrier for data communication, so that the operating efficiency of the monitoring system is improved and the charging reliability is ensure, and the load on the communication network is alleviated as well.

CONTENTS OF THE INVENTION

The object of the present invention is to provide a super-capacitor charging main monitoring system, which incorporates power line carrier communication, microcomputer control techniques, and voltage and temperature detection techniques, and can be applied in new energy vehicle and engineering machinery fields, so as to solve the problems in the conventional charging approach, such as energy waste and environmental pollution.

The object of the present invention is attained with the following technical scheme:

A monitoring system, comprising power lines, single super-capacitor monitoring subsystems, and a main monitoring system;

The main monitoring system receives the data sent from the monitoring subsystems, and comprises a power supply unit, a master single-chip microcomputer, a carrier communication module PL2102, a man-machine interface module, a storage unit, a RS-232 module, and a charging circuit; the power supply unit supplies electric power to the master single-chip microcomputer, the master single-chip microcomputer is connected to the carrier communication module PL2102, and utilizes power line carrier to implement communication between the single super-capacitor monitoring subsystems and the main monitoring system through electric power lines that serve as the medium; the master single-chip microcomputer is connected to the man-machine interface module to accomplish alarming and display; the master single-chip microcomputer is connected to the storage unit, and is connected to a computer via serial ports in the RS-232 module; the master single-chip microcomputer is connected to the charging circuit, and controls the charging circuit to output appropriate electric current according to the charging state; the master single-chip microcomputer in the main monitoring system receives the data sent from the single super-capacitor monitoring subsystems in a sending state; when the main monitoring system is in a receiving state, the spread spectrum signal in the DC electric power line is transmitted via a coupling transformer through a receiving frequency selective network to the carrier communication module PL2102 for demodulation, and then inputted to a digital signal processor in the single-chip microcomputer; if the charging state of a single super capacitor is abnormal, the main monitoring system will provide an error instruction, generate an alarm signal, stop the charging process, and display the corresponding serial number of the single super capacitor on the man-machine interface;

The single super-capacitor monitoring subsystem acquires data information, carries out data operation and processing to calculate the state of charge of the super capacitor and judge the status of the single super capacitor, and selectively transmits the data to the main monitoring system. The single super-capacitor monitoring subsystem comprises a single super capacitor, a power supply unit, a slave single-chip microcomputer, a carrier communication module, units for detecting voltage, current, and temperature, and a storage unit; the power supply unit is responsible for power supply, the units for detecting voltage, current, and temperature are connected to the slave single-chip microcomputer, the slave single-chip microcomputer detects the voltage, current, and temperature information transmitted via each ports uninterruptedly, and calculates the state of charge of the super capacitor; the slave single-chip microcomputer is connected to the storage unit to store data and send the data to the master single-chip microcomputer in the main monitoring system; wherein, the data transmission between the single super-capacitor monitoring subsystems and the main monitoring system is accomplished via the carrier communication module PL2102 through the electric power lines;

The main monitoring system charges a super capacitor bank through the electric power lines and the charging circuit, and the electric power lines also serve as the communication medium; the communication between the main monitoring system and the single super-capacitor monitoring subsystems is accomplished via the carrier communication module through the electric power lines; one main monitoring system is provided, while one or more single super-capacitor monitoring subsystems are provided; each single super-capacitor monitoring subsystem has a unique address and has an serial number determined by the slave single-chip microcomputer.

Beneficial effects: with the technical scheme described above, single super-capacitor monitoring subsystems in the super-capacitor charging monitoring system utilize the real-time voltage, current and temperature value acquired to calculate the value of state of charge (SOC) and its change rate with Kalman filtering algorithm; when the SOC of the single super capacitor is within the range of a preset threshold, the single super capacitor monitoring subsystem does not send the specific data to the main monitoring system; when the SOC of the single super capacitor is out of the range of the preset threshold, the slave single-chip microcomputer will send the data by category and level to the master single-chip microcomputer in the main monitoring system; the subsystems utilize a priority-based CSMA/CA strategy to compete for the channel, and, after the access right is obtained, the carrier communication module PL2102 will treat the digital signals sent from the single-chip microcomputer MSP430 by Differential Phase Shift Keying (DPSK) modulation and then output the signals to the driver circuit; then, the signals are coupled via the transformer to the DC power lines.

The master single-chip microcomputer in the main monitoring system receives the data sent from the single super-capacitor monitoring subsystems in a sending data; when the main monitoring system is in a receiving state, the spread spectrum signal in the DC power lines is transmitted via the coupling transformer through the receiving frequency selective network to the carrier communication module PL2102 for demodulation, and then input to the DSP in the single-chip microcomputer; if the charging state of a single super capacitor is abnormal, the main monitoring system will provide an error instruction, generate an alarm signal, stop the charging process, and display the corresponding serial number of the single super capacitor on the man-machine interface.

Advantages: super capacitors are energy-saving, environmental friendly, reliable, and durable, etc., and are a good approach for solving the problems in existing batteries. In the charging process of a series super capacitor bank, over-charging may happen easily due to the small difference among the single super capacitors, and thereby the service life of the super capacitors is affected adversely; the monitoring system can master the charging status of each single super capacitor in the super capacitor bank in real time, so that an over-charging phenomenon is avoided.

DESCRIPTION OF THE DRAWINGS

FIG. 1 is a schematic structural diagram of the super-capacitor charging main monitoring system.

In the drawing: 1—single super capacitor; 2—charging circuit; 3—carrier communication module; 4—master single-chip microcomputer; 5—man-machine interface module; 6—storage unit; 7—power supply unit; 8—RS-232 module; 9—voltage and current detecting unit; 10—temperature detecting unit; 11—slave single-chip microcomputer.

DETAILED DESCRIPTION OF THE EMBODIMENTS

Embodiment 1

A super-capacitor charging monitoring system, comprising power lines, single super-capacitor monitoring subsystems, and a main monitoring system, wherein, the main monitoring system comprises a charging circuit 2, a carrier communication module 3, a master single-chip microcomputer 4, a man-machine interface module 5, a storage unit 6, a power supply unit 7 and a RS-232 module 8. The power supply unit supplies electric power to the master single-chip microcomputer, the master single-chip microcomputer is connected to the carrier communication module PL2102, and utilizes power line carrier to implement communication between the single super-capacitor monitoring subsystems and the main monitoring system through electric power lines that serve as the medium; the master single-chip microcomputer is connected to the man-machine interface module, to accomplish alarming and display; the master single-chip microcomputer is connected to the storage unit, and is connected to a computer via serial ports in the RS-232; the master single-chip microcomputer is connected to the charging circuit, and controls the charging circuit to output appropriate electric current according to the charging state; the master single-chip microcomputer in the main monitoring system receives the data sent from the single super-capacitor monitoring subsystems in a sending state; when the main monitoring system is in a receiving state, the spread spectrum signal in the DC power line is transmitted via the coupling transformer through the receiving frequency selective network to the carrier communication module PL2102 for demodulation, and then inputted to a digital signal processor in the single-chip microcomputer; if the charging state of a single super capacitor is abnormal, the main monitoring system will provide an error instruction, generate an alarm signal, stop the charging process, and display the corresponding serial number of the single super capacitor on the man-machine interface. The storage unit 6 is a memory module. The digital signal processor in the single-chip microcomputer is abbreviated as DSP.

The single super-capacitor monitoring subsystem comprises a single super capacitor 1, a power supply unit 7, a slave single-chip microcomputer 11, a carrier communication module 3, a voltage and current detecting unit 9, a temperature detecting unit 10, and a storage unit 6. The electric power lines connect the single super-capacitor monitoring subsystem to the main monitoring system. The power supply unit is responsible for power supply; the units for detecting voltage, current and temperature are connected to the slave single-chip microcomputer MSP430, the slave single-chip microcomputer MSP430 detects the voltage, current and temperature information transmitted via each ports uninterruptedly, and calculates the state of charge (SOC) of the super capacitor; the slave single-chip microcomputer MSP430 is connected to the storage unit to store data and send the data to the master single-chip microcomputer in the main monitoring system; wherein, the data transmission between the single super-capacitor monitoring subsystem and the main monitoring system is accomplished via the carrier communication module PL2102 through the electric power lines. The state of charge of the super capacitor is abbreviated as SOC.

The main monitoring system charges a super capacitor bank through the electric power lines and the charging circuit 2, and the electric power lines also serve as the communication medium; the communication between the main monitoring system and the single super-capacitor monitoring subsystems is accomplished via the carrier communication module through the electric power lines; one main monitoring system is provided, while one or more single super-capacitor monitoring subsystems are provided; each single super-capacitor monitoring subsystem has a unique address and has an serial number determined by the slave single-chip microcomputer.

Both the main monitoring system and the slave monitoring systems obtain DC power supply from the power supply unit 7, wherein, 3.3 V voltage is supplied to the master single-chip microcomputer and slave single-chip microcomputers, 5 V voltage is supplied to the carrier communication module, and 12 V voltage is supplied to the carrier power amplifier circuit.

In the single super-capacitor monitoring subsystem, the slave single-chip microcomputer MSP430 is preset with several levels of alarm thresholds, according to the model and specification of the super capacitor, wherein, the maximum permissible value of the calculated state of charge (SOC) of the super capacitor is threshold 1, and the maximum permissible value of the calculated SOC change rate is threshold 2. The calculated SOC change rate of the super capacitor is defined as the ratio of the difference between adjacent calculated SOC values of the super capacitor to the sampling interval.

In the single super-capacitor monitoring subsystem, the temperature detecting unit 10 employs a high-precision temperature sensor, which can measure the actual temperature accurately; the voltage and current detecting unit 9 is connected to the two ends of the super capacitor to measure voltage and current value accurately; the slave single-chip microcomputer MSP430 detects the voltage, current and temperature value sent from the ports uninterruptedly, and calculates the SOC and SOC change rate of the super capacitor with Kalman filtering algorithm.

When both the SOC value and the change rate of the single super capacitor are within the ranges of the preset thresholds, the single super-capacitor monitoring subsystem will send 1-byte handshake information to the main monitoring system, with the priority defined as 1; when the calculated SOC value of the super capacitor is within the range of the threshold 1 and the calculated SOC change rate of the super capacitor is out of the range of the threshold 2, the single super-capacitor monitoring subsystem will send 1-byte handshake information and 2-byte calculated SOC change rate of the super capacitor to the main monitoring system, with the priority defined as 2; when the SOC change rate of the single super capacitor is within the range of the threshold 2 and the calculated SOC value of the super capacitor is out of the range of the threshold 1, the single super-capacitor monitoring subsystem will send 1-byte handshake information and 2-byte calculated SOC value to the main monitoring system, with the priority defined as 3; when both the SOC value and the SOC change rate of the single super capacitor are out of the ranges of the preset thresholds, the single super-capacitor monitoring subsystem will send 1-byte handshake information, 2-byte SOC value and 2-byte SOC change rate to the main monitoring system, with the priority defined as 4.

When the slave single-chip microcomputer MSP430 is in a sending state, the carrier communication module PL2102 will output and transmit the digital signals sent from the single-chip microcomputer MSP430 to the driver circuit, after internal Differential Phase Shift Keying (DPSK) modulation, and output the modulated signals; then, the signals are coupled via the transformer to the DC power lines. The Differential Phase Shift Keying in the carrier communication module PL2102 is abbreviated as DPSK.

The system employs a priority-based CSMA/CA strategy to deal with concurrent data sending requests from multiple monitoring subsystems. When a slave single-chip microcomputer is ready to send data, firstly it detects whether there is any signal in the frequency band in the communication line; if there is such a signal, the slave single-chip microcomputer will wait for a specific time and then detect the communication line again, till it finds that the line is idle or the maximum permissible number of trials is reached. When the slave single-chip microcomputer finds the line is idle, it will transmit the data to the master single-chip microcomputer; when the slave single-chip microcomputer finds the maximum permissible number of trials is reached, to ensure data validity, it will discard the data, select new data to be sent, and repeat the process described above. Wherein, the waiting time is defined as back-off time, and the maximum permissible number of trials is defined as maximum times of back-off. In this system, the back-off time and maximum times of back-offs of the slave single-chip microcomputer are determined according to the priority of the data to be transmitted. The higher the priority is, the shorter the back-off time is, and the smaller the maximum times of back-off is. In the actual application, the specific back-off time and maximum times of back-off are determined according to the requirement for system accuracy and the parameters of the single capacitors.

The function of the master single-chip microcomputer in the main monitoring system is to receive data sent from the single super-capacitor monitoring subsystems in a sending status. When the main monitoring system is in a receiving status, the spread spectrum signals in the DC power lines are transmitted via the coupling transformer through the receiving frequency selective network to the carrier communication module PL2102 for demodulation, and then the demodulated signals are inputted to the DSP in the single-chip microcomputer.

The main monitoring system displays the information received from the monitoring subsystems by category, and notifies the operator. In case the priority of the information is higher than 2, the main monitoring system will directly stop the charging process and display the corresponding serial number of the single super capacitor on the man-machine interface.

Both the main monitoring system and the single super-capacitor monitoring subsystems include a storage unit 6 respectively, which is configured to store data and upload the data via the serial port in the RS-232 module, so that the performance of the super capacitor can be analyzed later.

The man-machine interface 5 displays and updates the charging status of the single super capacitors in real time. In case any important alarming information related to a super capacitor occurs, the man-machine interface will cause the alarm indicator to light up and flash, and provide a voice prompt at the same time.

The invention claimed is:

1. A super-capacitor charging monitoring system, comprising power lines, single super-capacitor monitoring subsystems, and a main monitoring system, wherein, the main monitoring system receives data sent from the monitoring subsystems, and comprises a power supply unit, a master single-chip microcomputer, a carrier communication module PL2102, a man-machine interface module, a storage unit, a RS-232 module, and a charging circuit; the power supply unit supplies electric power to the master single-chip microcomputer, the master single-chip microcomputer is connected to the carrier communication module PL2102, and utilizes power line carrier to implement communication between the single super-capacitor monitoring subsystems and the main monitoring system through electric power lines that serve as the medium; the master single-chip microcomputer is connected to the man-machine interface module to accomplish alarming and display; the master single-chip microcomputer is connected to the storage unit, and is connected to a computer via serial ports in the RS-232 module; the master single-chip microcomputer is connected to the charging circuit, and controls the charging circuit to output appropriate electric current according to a charging state; the master single-chip microcomputer in the main monitoring system receives the data sent from the single super-capacitor monitoring subsystems in a sending state; when the main monitoring system is in a receiving state, the spread spectrum signal in a DC electric power line is transmitted via a coupling transformer through a receiving frequency selective network to the carrier communication module PL2102 for demodulation, and then inputted to a digital signal processor in the single-chip microcomputer; if the charging state of a single super capacitor is abnormal, the main monitoring system will provide an error instruction, generate an alarm signal, stop the charging process, and display the corresponding serial number of the single super capacitor on the man-machine interface;

the single super-capacitor monitoring subsystem acquires data information, carries out data operation and processing to calculate the state of charge (SOC) of the single super capacitor and judge the status of the single super capacitor, and selectively transmits the data to the main monitoring system;

the single super-capacitor monitoring subsystem comprises a single super capacitor, a power supply unit, a slave single-chip microcomputer, a carrier communication module, units for detecting voltage, current, and temperature, and a storage unit; the power supply unit is responsible for power supply, the units for detecting voltage, current, and temperature are connected to the slave single-chip microcomputer, the slave single-chip microcomputer detects the voltage, current, and temperature information transmitted via each port uninterruptedly, and calculates the SOC of the super capacitor; the slave single-chip microcomputer is connected to the storage unit to store data and send the data to the master single-chip microcomputer in the main monitoring system; wherein, the data transmission between the single super-capacitor monitoring subsystems and the main monitoring system is accomplished via the carrier communication module PL2102 through the electric power lines;

the main monitoring system charges a super capacitor bank through the electric power lines and the charging circuit, and the electric power lines also serve as a communication medium; the communication between the main monitoring system and the single super-capacitor monitoring subsystems is accomplished via the carrier communication module through the electric power lines; one main monitoring system is provided, while one or more single super-capacitor monitoring subsystems are provided; each single super-capacitor monitoring subsystem has a unique address and has a serial number determined by the slave single-chip microcomputer.

* * * * *